United States Patent
Wang et al.

(10) Patent No.: US 7,303,996 B2
(45) Date of Patent: Dec. 4, 2007

(54) HIGH-K GATE DIELECTRIC STACK PLASMA TREATMENT TO ADJUST THRESHOLD VOLTAGE CHARACTERISTICS

(75) Inventors: Ming-Fang Wang, Taichung (TW); Tuo-Hung Hou, Chiayi (TW); Kai-Lin Mai, Jhonghe (TW); Liang-Gi Yao, Hsing-chu (TW); Shih-Chang Chen, Hsin-chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 416 days.

(21) Appl. No.: 10/677,158

(22) Filed: Oct. 1, 2003

(65) Prior Publication Data
US 2005/0074978 A1    Apr. 7, 2005

(51) Int. Cl.
*H01L 21/302* (2006.01)

(52) U.S. Cl. .............. 438/712; 438/714; 438/710; 438/585; 438/734; 438/627

(58) Field of Classification Search ............... 438/706
See application file for complete search history.

(56) References Cited

U.S. PATENT DOCUMENTS

| | | | | |
|---|---|---|---|---|
| 4,457,825 A * | 7/1984 | Lamont, Jr. | ............ | 204/298.12 |
| 4,906,589 A * | 3/1990 | Chao | ............ | 438/305 |
| 5,075,641 A * | 12/1991 | Weber et al. | ............ | 311/108 C |
| 5,085,727 A * | 2/1992 | Steger | ............ | 156/345.47 |
| 5,282,546 A * | 2/1994 | Bauer | ............ | 220/565 |
| 5,644,158 A * | 7/1997 | Fujii et al. | ............ | 257/532 |
| 6,136,725 A * | 10/2000 | Loan et al. | ............ | 438/758 |
| 6,458,714 B1 * | 10/2002 | Powell et al. | ............ | 438/770 |
| 6,596,599 B1 * | 7/2003 | Guo | ............ | 438/305 |
| 6,740,605 B1 * | 5/2004 | Shiraiwa et al. | ............ | 438/795 |
| 6,797,576 B1 * | 9/2004 | Teng et al. | ............ | 438/305 |
| 6,803,275 B1 * | 10/2004 | Park et al. | ............ | 438/257 |
| 2002/0115252 A1 * | 8/2002 | Haukka et al. | ............ | 438/240 |
| 2002/0175393 A1 * | 11/2002 | Baum et al. | ............ | 257/506 |
| 2003/0194853 A1 * | 10/2003 | Jeon | ............ | 438/591 |
| 2004/0152304 A1 * | 8/2004 | Sarigiannis et al. | ............ | 438/680 |
| 2004/0241920 A1 * | 12/2004 | Hsiao et al. | ............ | 438/158 |
| 2005/0074983 A1 * | 4/2005 | Shinriki et al. | ............ | 438/785 |
| 2005/0101147 A1 * | 5/2005 | Labelle et al. | ............ | 438/710 |

OTHER PUBLICATIONS

Wolf; silicon Processing; vol. 1, p. 58; para.2 1985; isbn 0-9616721-3-7.*
Intel: Glossary for Intel's High K, Metal Gate Transistor Announcement; Apr. 2004.*

* cited by examiner

*Primary Examiner*—Nadine G. Norton
*Assistant Examiner*—Patricia A. George
(74) *Attorney, Agent, or Firm*—Thomas, Kayden, Horstemeyer & Risley

(57) ABSTRACT

A method for treating a gate structure comprising a high-K gate dielectric stack to improve electric performance characteristics including providing a gate dielectric layer stack including a binary oxide over a silicon substrate; forming a polysilicon layer over the gate dielectric layer stack; lithographically patterning and etching to form a gate structure; and, carrying out at least one plasma treatment of the gate structure comprising a plasma source gas selected from the group consisting of $H_2$, $N_2$, $O_2$, and $NH_3$.

20 Claims, 3 Drawing Sheets

HIGH-K GATE DIELECTRIC STACK PLASMA TREATMENT TO ADJUST THRESHOLD VOLTAGE CHARACTERISTICS

FIELD OF THE INVENTION

The present invention relates generally to high-K CMOS transistor gate stack fabrication processes in micro-integrated circuit fabrication and more particularly, to a method of treating a gate structure including a high-K dielectric gate stack to improve the threshold Voltage behavior in a CMOS device.

BACKGROUND OF THE INVENTION

Fabrication of a metal-oxide-semiconductor (MOS) integrated circuit involves numerous processing steps. A gate oxide is typically formed from thermally grown silicon dioxide over a silicon substrate which is doped with either n-type or p-type dopants. For each MOS field effect transistor (MOSFET) being formed, a gate electrode is formed over the gate dielectric, and dopant impurities are then introduced into the semiconductor substrate to form source and drain regions. Many modern day semiconductor microelectronic fabrication processes form features having less than 0.25 micron critical dimensions, for example more recent devices include features sizes of less than 0.13 microns. As design rules decrease, the size of a resulting transistor as well as transistor features, for example gate length, also decrease according to scaling relationships. As gate lengths decrease, the problem of current leakage, for example gate induced drain leakage (GIDL) becomes more severe, which is a problem for low power devices, requiring increased transistor off current.

In order to overcome this phenomenon, an increasing trend in semiconductor microelectronic device fabrication is to use high-K (high dielectric constant materials) in the gate dielectric stack to achieve an equivalent oxide thickness (EOT) with thicker high-K materials. Because of high tunneling currents, $SiO_2$ films thinner than about 20 Angstroms cannot be reliably used as gate dielectrics in CMOS devices. There are currently intense efforts to replace traditional $SiO_2$ gate dielectric films with high-K dielectric materials. A high dielectric constant allows a thicker gate dielectric to be formed which dramatically reduces tunneling current and consequently gate leakage current, thereby overcoming a severe limitation in the use of $SiO_2$ as the gate dielectric at smaller device critical dimensions.

There have been, however, difficulties in forming high-k gate dielectrics to achieve acceptable threshold Voltage behavior in CMOS devices. Frequently, a relatively large shift in flatband Voltage or equivalent threshold Voltage occurs when high-K dielectrics are used in a gate dielectric stack for both NMOS and PMOS devices. For example, hafnium oxide (e.g., $HfO_2$) when used in the gate dielectric stack exhibits a shift of from about 300 mV in NMOS devices and about 700 mV in PMOS devices compared to a conventional $SiO_2$ gate dielectric.

The presence of unwanted interfacial states is believed to contribute to flatband and threshold Voltage shifts. Several approaches, from treating the base oxide layer, to post deposition annealing of the high-K dielectric prior to polysilicon electrode layer deposition have been proposed. Proposed approaches so far have met with limited success, threshold Voltages still exhibiting larges differences compared to normal or desired behavior achieved with conventional $SiO_2$ gate dielectrics. As a result, the integration of high-K gate dielectric stacks with acceptable electrical behavior including acceptable threshold Voltage behavior in low power CMOS devices remains a problem to be overcome.

Therefore it would be advantageous to develop an improved method for forming gate structures including high-K dielectric layer stacks in CMOS devices having improved electrical performance including threshold Voltage performance.

It is therefore an object of the invention to provide an improved method for forming gate structures including high-K dielectric layer stacks in CMOS devices having improved electrical performance including threshold Voltage performance, while overcoming other shortcomings and deficiencies of the prior art.

SUMMARY OF THE INVENTION

To achieve the foregoing and other objects, and in accordance with the purposes of the present invention, as embodied and broadly described herein, the present invention provides a method for treating a gate structure comprising a high-K gate dielectric stack to improve electric performance characteristics.

In a first embodiment, the method includes providing a gate dielectric layer stack including a binary oxide over a silicon substrate; forming a polysilicon layer over the gate dielectric layer stack; lithographically patterning and etching to form a gate structure; and, carrying out at least one plasma treatment of the gate structure comprising a plasma source gas selected from the group consisting of $H_2$, $N_2$, $O_2$, and $NH_3$.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to the formation of an exemplary high-K gate dielectric stack, it will be appreciated that the method of the present invention may be used for the formation of high-K gate dielectrics for MOSFET devices as well as capacitor stacks in a micro-integrated circuit manufacturing process.

Although the method of the present invention is explained with reference to the use of exemplary high-k gate dielectrics it will be appreciated that the method of the present invention may be adapted for the use of any high-k oxide, for example a binary oxide material in the formation of a gate dielectric. By the term high-k dielectric is meant a material that has a dielectric constant of greater than about 10. The term "substrate" is defined to mean any semiconductor substrate material including conventional silicon semiconductor wafers.

Figure 1:
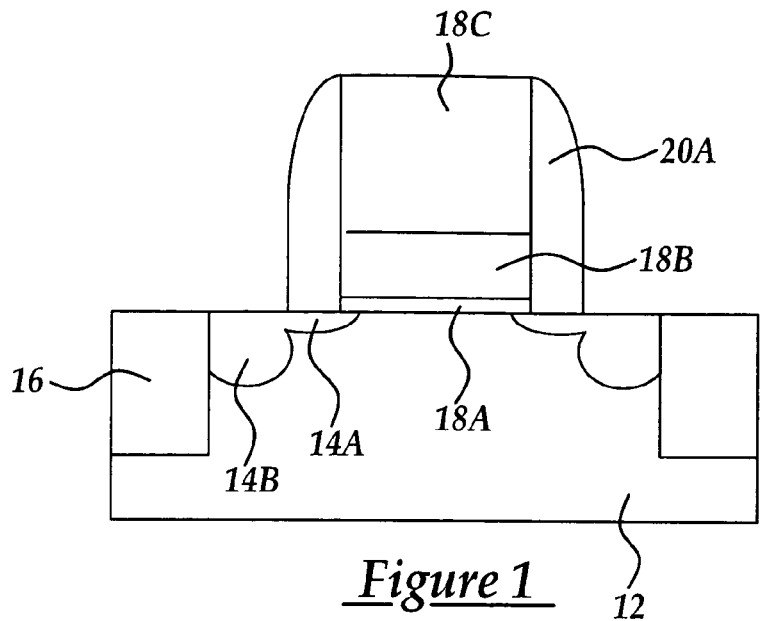
FIG. 1, is an exemplary CMOS device including a high-K dielectric stack formed according to an embodiment of the invention.

"Referring to FIG. 1 is shown a cross sectional schematic of an exemplary CMOS transistor having gate structure including a hiqh-k dielectric gate stack region according to an embodiment of the present invention. Shown is semiconductor substrate 12, for example a silicon substrate including lightly doped regions e.g., 14A, source/drain regions, e.g., 14B and shallow trench isolation regions, e.g., 16 formed in the silicon substrate by conventional methods known in the art. The regions 14A and 14B are typically formed following the formation of the gate structure. The gate dielectric portion at the gate structure is formed of multiple layers including for example, an interfacial silicon dioxide layer 18A, and high-K dielectric portion 18B. A polysilicon gate electrode portion 18C is formed over the gate dielectric portion. The gate structure is formed by conventional methods including photolithographic patterning and anisotropic etching steps following blanket deposition of the various layers including an uppermost polysilicon layer.

Following gate structure formation a first ion implantation process is typically carried out to form LDD regions e.g., 14A in the silicon substrate. Sidewall spacers e.g., 20A, are then formed including for example at least one of silicon oxide (e.g., $SiO_2$), silicon oxynitride (e.g., SiON), and silicon nitride (e.g., SiN) including multiple layered spacers by methods known in the art including conventional deposition and etchback processes. A second ion implantation process is then carried out to form the source/drain regions e.g., 14B in a self aligned ion implantation process where the sidewall spacers e.g., 20A act as an implantation mask to form N type or P type doping regions depending on whether a PMOS or NMOS type device is desired.

Figure 2A:
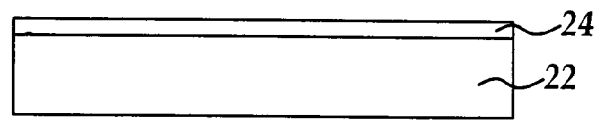
FIGS. 2A-2C are cross sectional views of a portion of an exemplary gate structure including a multi-layer high-K dielectric layer stack at stages in manufacture according to an embodiment of the present invention.

Referring to FIG. 2A is shown an expanded cross sectional side view of a portion of an exemplary gate stack region at stages in manufacture according to an embodiment of the present invention. In an exemplary embodiment, shown is semiconductor substrate 22, for example single crystalline silicon having (111) or (100) orientation. The substrate may also be a layered semiconductor substrate such as Si/SiGe or $Si/SiO_2/Si$. The substrate may be of the n or p-type and preferably includes several active regions, for example N or P doped regions forming active charge carrying regions forming a portion of a MOFSET device.

Still referring to FIG. 2A, in an exemplary embodiment of the present invention, in a first step the silicon substrate 22 is cleaned prior to formation of an overlying thermally grown $SiO_2$ interfacial layer 24, also referred to as a base oxide layer. For example, the silicon substrate is cleaned using standard cleaning 1 (SC-1) and/or standard cleaning-2 (SC-2) solutions, which may be individually or sequentially used cleaning solutions including mixtures of $NH_4OH$—$H_2O_2$—$H_2O$, and HCl—$H_2O_2$—$H_2O$, respectively.

Still referring to FIG. 2A, in one embodiment of the invention, following the silicon substrate cleaning process, an interfacial oxide ($SiO_2$) layer 24 is formed over the silicon substrate 20, preferably to a thickness of between about 5 Angstroms to about 30 Angstroms by a wet or dry thermal oxidation or chemical oxidation method. High temperature wet or dry thermal oxide growth methods are preferred due to a superior quality $Si/SiO_2$ interface.

Figure 2B:
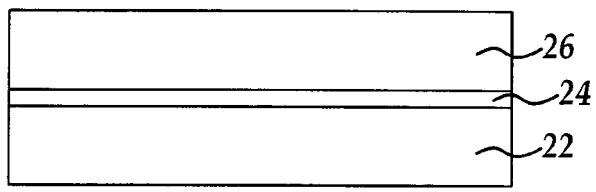

Referring to FIG. 2B, at least one high-K dielectric layer e.g., 26 is then deposited over the interfacial oxide layer 22 by conventional methods. It will be appreciated that the interfacial oxide layer 24 may be optionally subjected to surface treatments including chemical, plasma and/or annealing treatments as are known in the art prior to high-K material deposition. It will additionally be appreciated that the high-K dielectric layer or stack may also be deposited directly onto the silicon substrate; however an interfacial oxide layer e.g., 24 is preferably provided for high-K dielectric stability when using binary oxide high-K dielectrics such as hafnium oxide ($HfO_2$).

The high-K dielectric layer or stack 26 may be deposited by conventional methods, including atomic layer chemical vapor deposition (ALCVD), laser ablation, and reactive DC sputtering. Preferred high-K dielectrics include binary metal oxides such as tantalum oxides (e.g., $Ta_2O_5$), titanium oxides, (e.g., $TiO_2$), hafnium oxides (e.g., $HfO_2$), yttrium oxides (e.g., $Y_2O_3$), lanthanum oxides (e.g., $La_2O_5$), zirconium oxides (e.g., $ZrO_2$), and silicates and aluminates thereof.

The ALCVD deposition process preferably takes place with the wafer substrate heated from about 200° C. to about 400° C. An ALCVD process is preferred since it gives superior interface and film qualities. For example, molecular layers are sequentially deposited including a molecular layer of metal precursor, for example a metal-organic precursor, followed by controlled dissociation and oxidation of the metal-organic molecular layer to form a portion of the high-k dielectric layer, the process being sequentially repeated to complete the formation of the high-K dielectric layer. It will be appreciated that other processes such as MOCVD or PECVD using metal-organic precursors may be used as well, but are less preferred methods of deposition due to lower quality electrical properties.

In a most preferred embodiment, the high-K dielectric material includes a single layer or stacked layers of hafnium oxide (e.g., $HfO_2$) deposited by an ALCVD method at less than about 300° C., more preferably about 200° C. to minimize lattice mismatch. It will be appreciated that the thickness of the $HfO_2$ will vary depending on the equivalent oxide thickness (EOT) desired, for example between about 5 Angstroms and 30 Angstroms. For example, the $HfO_2$ layer thickness may vary between about 40 Angstroms and about 100 Angstroms. Following deposition of the high-K dielectric layer or layers the high-K dielectric may be subjected to one or more annealing treatments, preferably including at least one of nitrogen, hydrogen or oxygen at between about 550° C. and 900° C.

Figure 2C:
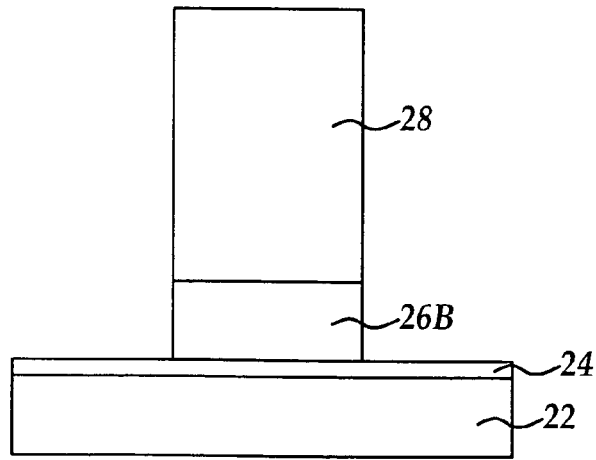

Referring to FIG. 2C, following deposition of the high-K dielectric layer e.g., 26, a polysilicon layer is deposited by conventional methods, for example LPCVD at less than about 580° C. followed by conventional lithographic patterning and etching, preferably RIE and/or chemically dependent etching (CDE), to etch through a thickness of the polysilicon layer to form the polysilicon gate electrode portion 28 and through a thickness portion of the $HfO_2$ layer e.g., 26 to form high-K gate dielectric portion 26B while leaving at least a portion of the interfacial oxide layer 24 covering the silicon substrate. The interfacial oxide layer portion advantageously serves to protect the silicon substrate 22 in the subsequent plasma treatment process.

According to an aspect of the present invention, following the gate etching process, the process wafer including the gate structure is subjected to a plasma treatment process. The plasma treatment is preferably carried out at pressures between about 100 mTorr and about 10 Torr, more preferably between about 1 Torr and about 5 Torr. The plasma treatment preferably includes the plasma source gases $H_2$, $N_2$, $O_2$, and $NH_3$ or mixtures thereof. More preferably the plasma source gas includes hydrogen or nitrogen or mixtures thereof. Most preferably, the plasma source gas is hydrogen, due to minimal plasma damage and more efficient thermally activated diffusion in a subsequent annealing process.

The plasma treatment may include conventional plasma operating conditions and plasma reactors including for example, inductively coupled plasma source (ICP), parallel plate, electron cyclotron resonance (ECR), dual plasma source (DPS), and magnetically enhanced configurations. More preferably, the plasma reactor includes a DPS source to allow for independent wafer biasing. Exemplary operating conditions include an RF power of between about 100 Watts and about 600 Watts and a wafer bias between about 0 Watts and about 300 Watts.

Depending on the reactor configuration, for example a DPS reactor, the plasma treatment is carried out between about 10 minutes and about 60 minutes. Following the plasma treatment, preferably a post plasma treatment annealing process is carried out in an ambient including at least one of $H_2$, $N_2$, $O_2$, and $NH_3$, more preferably primarily a nitrogen ($N_2$) or hydrogen containing ambient in the case of a plasma treatment with $H_2$, $N_2$, and $NH_3$. The annealing process is preferably carried out at a temperature between about 550° C. and about 750° C. for about 5 minutes to about 30 minutes. It will be appreciated that the annealing process may be carried out in-situ following the plasma treatment, or may be carried out ex-situ in a separate single wafer treatment tool or in a batch wafer annealing process in a conventional furnace.

It has been found according to preferred embodiments of the present invention that the plasma treatment of the gate structure including the polysilicon gate electrode and high-K dielectric stack sidewall portions, followed by a post plasma treatment anneal gives the best results in advantageously adjusting the flatband Voltage, and consequently the threshold Voltage, such that the electrical operating parameters of a completed CMOS device are within an operating range comparable to CMOS devices with $SiO_2$ gate dielectrics. While not bound by any particular theory, it is believed that dangling, or unsaturatively coordinated Si Bonds form at the binary oxide (e.g., $HfO_2$)/polysilicon interface, for example due to lattice mismatch effects. By performing at least a plasma treatment, more preferably followed by an annealing treatment according to preferred embodiments, plasma implanted atoms such as hydrogen, nitrogen, and oxygen, more preferably hydrogen and/or nitrogen, penetrate and thermally diffuse to the $HfO_2$/polysilicon interface to passivate or bond with the dangling bonds. As a result, interface states acting as electron/hole traps are advantageously reduced thereby improving flatband and consequently threshold Voltage behavior in both PMOS and NMOS devices.

Figure 3A:
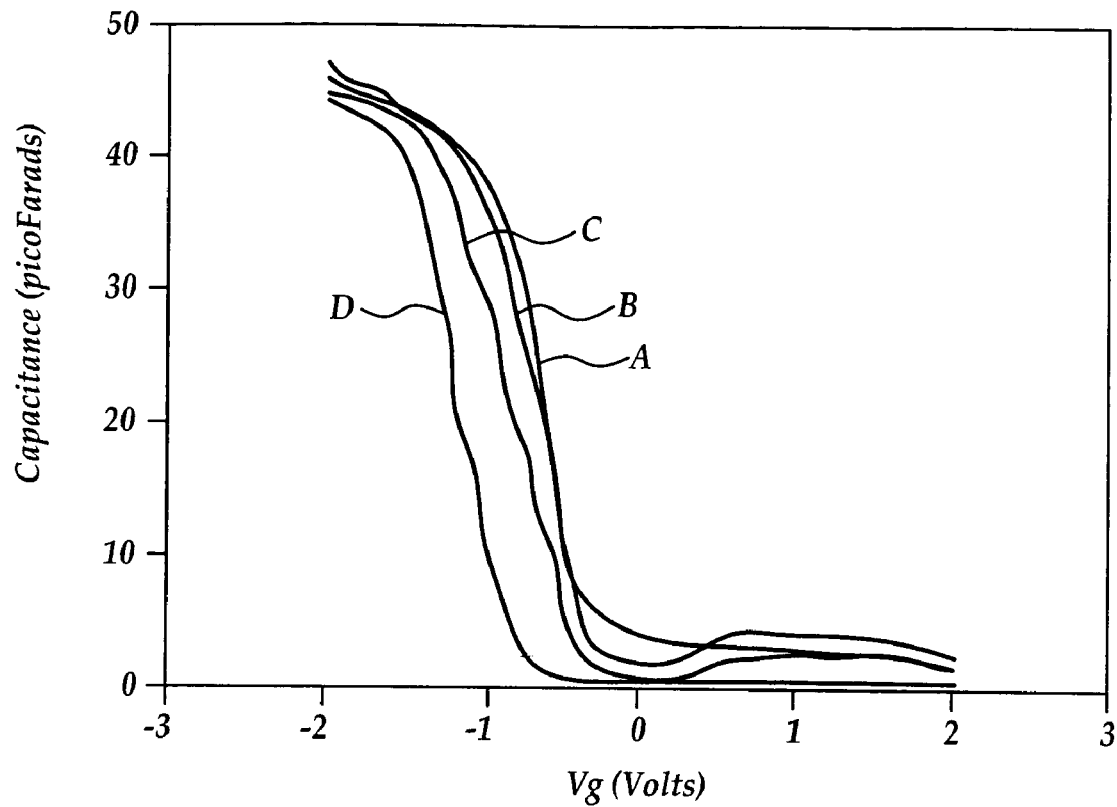
FIG. 3A is a graphical representation of exemplary Capacitance-Voltage (CV) data taken of exemplary CMOS devices formed according to preferred embodiments contrasted with a processing method excluding embodiments of the present invention.

For example, referring to FIG. 3A, is shown a graph of exemplary data (CV curve) with capacitance on the vertical axis and applied gate Voltage on the horizontal axis exemplary NMOS devices. Lines A, B, and C respectively represent 'as deposited' (A), i.e., with no plasma treatment of the gate stack including a high-K dielectric, shown jutaposed to devices formed having the gate stack exposed to increased times of a plasma treatment in hydrogen e.g., 30 min (B), and 60 min (C), Line D, by contrast, represents a device formed with the gate stack exposed to a plasma treatment followed by an annealing treatment in nitrogen ($N_2$) according to preferred embodiments, demonstrating a significant improvement in the CV curve characteristics including flatband Voltage derived therefrom by known methods.

Figure 3B:
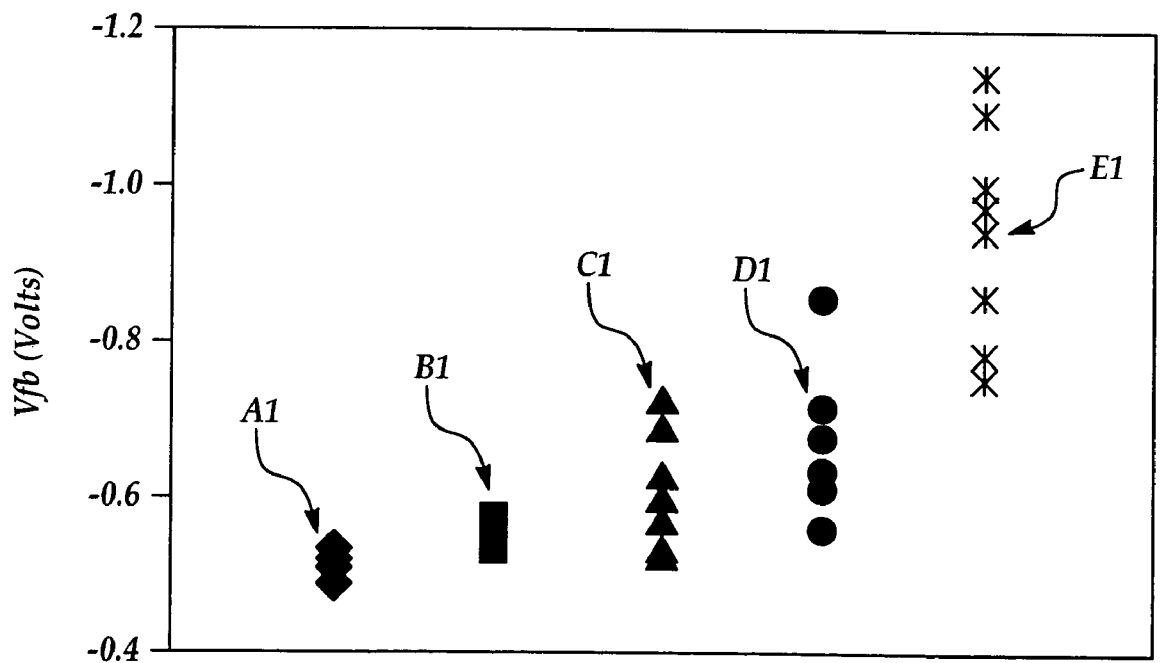
FIG. 3B is a graphical representation of exemplary flatband Voltage data derived from CV data taken of exemplary CMOS devices formed according to preferred embodiments contrasted with a processing method excluding embodiments of the present invention.

Referring to FIG. 3B, is shown a graph of exemplary data of CMOS devices with the flatband Voltage on the vertical axis and the gate stack treatment condition separated on the horizontal axis. Gate stact treatment condition A1 corresponds to 'as deposited' condition (without a plasma treatment or anneal treatment of the gate stack); gate stack treatment conditions B1, C1, and D1, respectively correspond to a 10, 30, and 60 minute $H_2$ plasma treatment according to preferred embodiments. Gate stack treatment condition E1, by contrast, shows a 60 minute $H_2$ plasma treatment followed by an annealing treatment according to preferred embodiments, showing a significant improvement in flatband Voltage.

Referring back to FIG. 1, following the annealing treatment, conventional processes are then carried out to complete the CMOS device including an ion implantation process to form LDD regions e.g., 14A in the silicon substrate followed by sidewall spacer formation e.g., 20A and a subsequent ion implantation process to form source/drain regions e.g., 14B.

Figure 4:
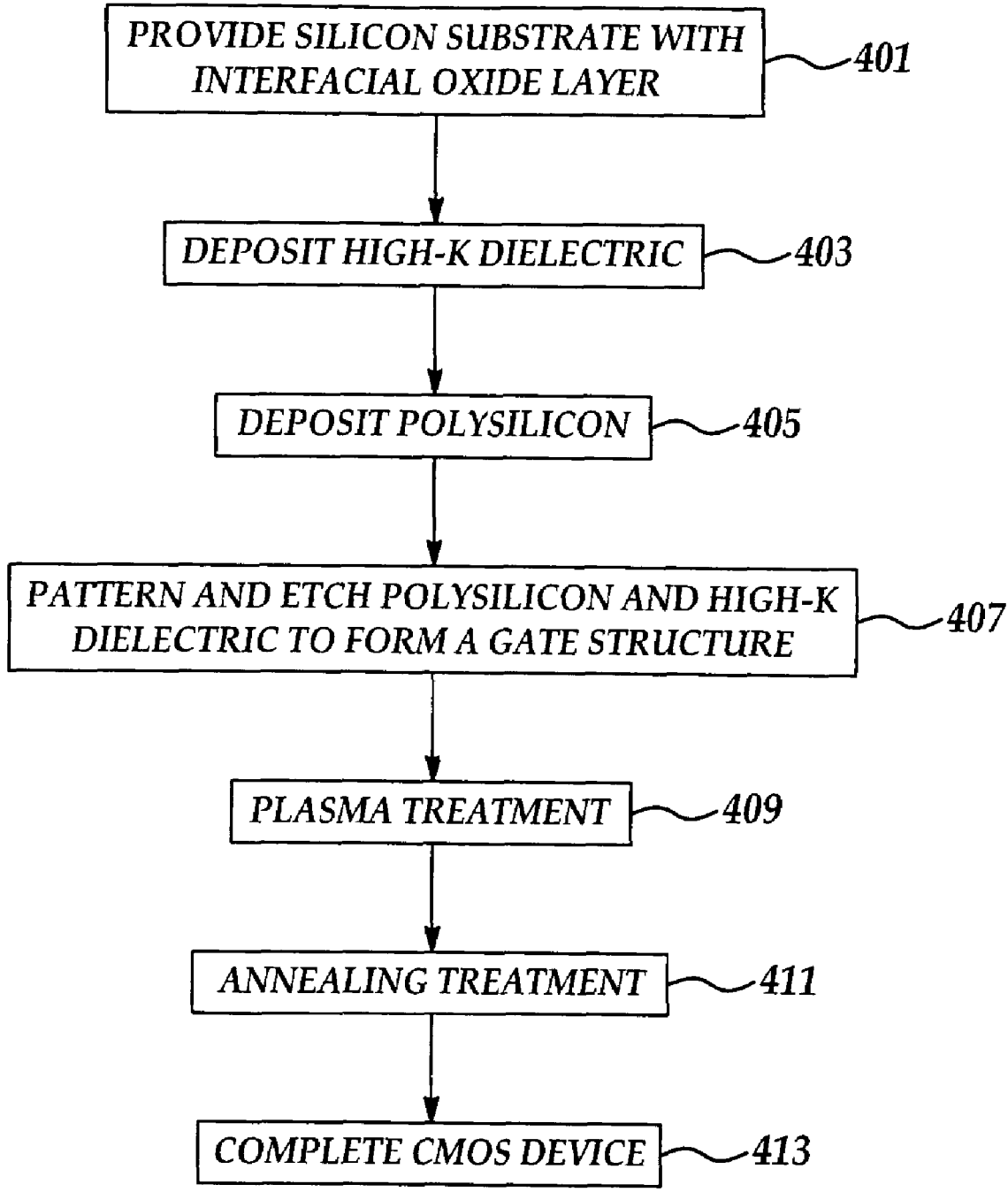
FIG. 4 is a process flow diagram including several embodiments of the present invention.

Referring to FIG. 4 is a process flow diagram including several embodiments of the present invention. In a first process 401, an interfacial oxide layer is provided over a silicon substrate. In process 403, at least one high-K dielectric layer, preferably $HfO_2$, is deposited over the interfacial oxide. In process 405, a polysilicon layer is deposited. In process 407, the polysilicon layer is patterned and etched through a thickness portion of the polysilicon and high-K dielectric to form a gate structure. In process 409, a plasma treatment is carried out according to preferred embodiments. In process 411, a post plasma treatment anneal is carried out according to preferred embodiments. In process 413, conventional processes are carried out to complete the CMOS device.

While the embodiments illustrated in the Figures and described above are presently preferred, it should be understood that these embodiments are offered by way of example only. The invention is not limited to a particular embodiment, but extends to various modifications, combinations, and permutations as will occur to the ordinarily skilled artisan that nevertheless fall within the scope of the appended claims.

What is claimed is:

1. A method for treating a gate structure comprising a high-K gate dielectric stack to reduce interface states between a high-k gate dielectric and a gate electrode comprising the steps of:

providing a gate dielectric layer stack comprising a high-k gate dielectric over a semiconductor substrate;

forming a gate electrode layer on the gate dielectric layer stack;

lithographically patterning and etching to form a gate structure; and, carrying out at least one plasma treatment of the gate structure following formation of the gate structure, said at least one plasma treatment comprising a plasma source gas selected from the group consisting of $H_2$, $N_2$, $O_2$, $NH_3$, and combinations thereof.

2. The method of claim 1, further comprising the step of annealing the gate structure following the at least one plasma treatment.

3. The method of claim 2, wherein the step of annealing comprises a temperature of from about 600° C. to about 750° C.

4. The method of claim 2, wherein the step of annealing comprises an ambient consisting essentially of nitrogen.

5. The method of claim 1, wherein the gate dielectric layer stack comprises a lowermost $SiO_2$ layer formed over the silicon substrate.

6. The method of claim 1, wherein the gate dielectric layer stack comprises a high-K material selected from the group consisting of tantalum oxides, titanium oxides, hafnium oxides, yttrium oxides, lanthanum oxides, zirconium oxides, and silicates and alumimates thereof.

7. The method of claim 1, wherein the dielectric layer stack consists essentially of a lowermost $SiO_2$ layer and an overlying hafnium oxide layer.

8. The method of claim 7, wherein the hafnium oxide layer is formed according to an ALCVD method at a temperature of less than about 300° C.

9. The method of claim 1, wherein the at least one plasma treatment consists if a plasma source gas selected from the group consisting of hydrogen ($H_2$), nitrogen ($N_2$), and combinations thereof.

10. The method of claim 1, wherein the plasma treatment is carried out at a pressure of between about 100 mTorr and about 10 Torr.

11. A method for treating a gate structure comprising a high-K gate dielectric stack to reduce interface states at a high-k gate dielectric/gate electrode interface comprising the steps of:
    providing a gate dielectric layer stack comprising at least one high-K dielectric over a semiconductor substrate;
    forming a gate electrode layer on the high-k dielectric layer;
    lithographically patterning and etching to form a gate structure;
    carrying out at least one plasma treatment of the gate structure following formation of the gate structure, said at least one plasma treatment comprising a plasma source gas selected from the group consisting of $H_2$, $N_2$, $O_2$, $NH_3$, and combinations thereof; and,
    annealing the gate structure following the at least one plasma treatment.

12. The method of claim 11, wherein the step of annealing comprises a temperature of from about 600° C. to about 750° C.

13. The method of claim 12, wherein the step of annealing comprises an ambient selected from the group consisting of $H_2$, $N_2$, $O_2$, $NH_3$ and combinations thereof.

14. The method of claim 11, wherein the gate dielectric layer stack comprises a lowermost $SiO_2$ layer formed over the semiconductor substrate.

15. The method of claim 11, wherein the high-K dielectric is selected from the group consisting of tantalum oxides, titanium oxides, hafnium oxides, yttrium oxides, lanthanum oxides, zirconium oxides, and silicates and aluminates thereof.

16. The method of claim 11, wherein the gate dielectric layer stack consists essentially of a lowermost $SiO_2$ layer and an overlying hafnium oxide layer.

17. The method of claim 11, wherein the plasma source gas consists essentially of hydrogen ($H_2$), nitrogen ($N_2$), and combinations thereof.

18. The method of claim 11, wherein the plasma treatment is carried out at a pressure of between about 100 mTorr and about 5 Torr.

19. A method for treating a gate structure comprising a high-k gate dielectric stack to improve electric performance characteristics comprising the steps of:
    providing a high-k gate dielectric layer over a semiconductor substrate;
    forming a gate electrode layer on the high-k gate dielectric layer;
    patterning said gate electrode layer and gate dielectric layer to form a gate structure; and
    providing a treatment of the gate structure following formation of the gate structure, said treatment selected from the group consisting of a thermal treatment and at least one plasma treatment, said treatment reducing interface states between the gate electrode layer and the high-k gate dielectric layer.

20. The method of claim 19, wherein the treatment comprises a plasma treatment followed by the thermal treatment.

* * * * *